US006991956B2

(12) United States Patent
Ghyselen et al.

(10) Patent No.: US 6,991,956 B2
(45) Date of Patent: Jan. 31, 2006

(54) METHODS FOR TRANSFERRING A THIN LAYER FROM A WAFER HAVING A BUFFER LAYER

(75) Inventors: Bruno Ghyselen, Seyssinet-Pariset (FR); Cécile Aulnette, Grenoble (FR); Bénédite Osternaud, Saint Egreve (FR); Nicolas Daval, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 11/032,844

(22) Filed: Jan. 10, 2005

(65) Prior Publication Data

US 2005/0191825 A1 Sep. 1, 2005

Related U.S. Application Data

(63) Continuation of application No. PCT/IB03/03466, filed on Jul. 9, 2003.

(30) Foreign Application Priority Data

Jul. 9, 2002 (FR) .................................. 02 08600

(51) Int. Cl.
*H01L 21/00* (2006.01)
*H01L 21/30* (2006.01)

(52) U.S. Cl. ............................ 438/46; 438/87; 438/93; 438/455

(58) Field of Classification Search .................. 438/46, 438/87, 93, 455, 473; 257/12, 19, 616
See application file for complete search history.

(56) References Cited

U.S. PATENT DOCUMENTS 5,882,987 A 3/1999 Srikrishnan ................. 438/458
5,906,951 A 5/1999 Chu et al. ................... 438/751

(Continued)

FOREIGN PATENT DOCUMENTS

GB 2365214 2/2002

(Continued)

OTHER PUBLICATIONS

L. J. Huang et al. "SiGe-On-Insulator prepared by wafer bonding and layer transfer for high-performance field-effect transistors", Applied Physics Letters, vol. 78, No. 9. Feb. 26, 2001.

(Continued)

*Primary Examiner*—Hsien-Ming Lee
(74) *Attorney, Agent, or Firm*—Winston & Strawn LLP

(57) ABSTRACT

A method for transferring a layer of semiconductor material from a wafer is described. The wafer includes a support substrate and an upper surface that includes a buffer layer of a material having a first lattice parameter. In an embodiment, the technique includes growing a strained layer on the buffer layer. The strained layer is made of a semiconductor material having a nominal lattice parameter that is substantially different from the first lattice parameter, and it is grown to a thickness that is sufficiently thin to avoid relaxation of the strain therein. The method also includes growing a relaxed layer on the strained layer. The relaxed layer is made of silicon and has a concentration of at least one other semiconductor material that has a nominal lattice parameter that is substantially identical to the first lattice parameter. The technique also includes providing a weakened zone in the buffer layer, and supplying energy to detach a structure at the weakened zone. The structure includes a portion of the buffer layer, the strained layer and the relaxed layer. Lastly; the method includes enriching the concentration of the at least one other semiconductor material in the relaxed layer of the structure.

23 Claims, 2 Drawing Sheets

U.S. PATENT DOCUMENTS

| | | | | |
|---|---|---|---|---|
| 6,059,895 | A | 5/2000 | Chu et al. | 148/33.1 |
| 6,100,166 | A | 8/2000 | Sakaguchi et al. | 438/455 |
| 6,323,108 | B1 | 11/2001 | Kub et al. | 438/458 |
| 6,403,450 | B1 | 6/2002 | Maleville et al. | 438/471 |
| 6,410,371 | B1 | 6/2002 | Yu et al. | 438/151 |
| 6,717,213 | B2 * | 4/2004 | Doyle et al. | 257/347 |
| 2002/0081861 | A1 | 6/2002 | Robinson et al. | 438/742 |

FOREIGN PATENT DOCUMENTS

| | | |
|---|---|---|
| WO | WO 99/52145 | 10/1999 |
| WO | WO 99/53539 | 10/1999 |
| WO | WO 01/11930 | 2/2001 |
| WO | WO 01/99169 | 12/2001 |
| WO | WO 02/15244 | 2/2002 |

OTHER PUBLICATIONS

Tong, Q.Y., et al., "Semiconductor Wafer Bonding Science & Technology", Wiley Interscience Publication, pp 1-15, 81-99.

* cited by examiner

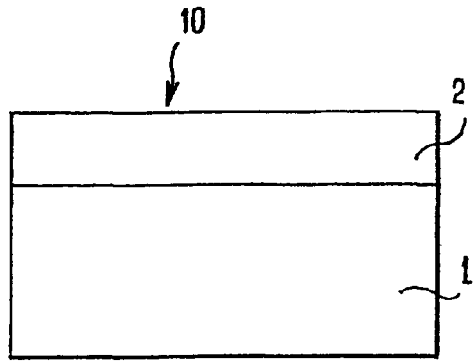
FIG_1a
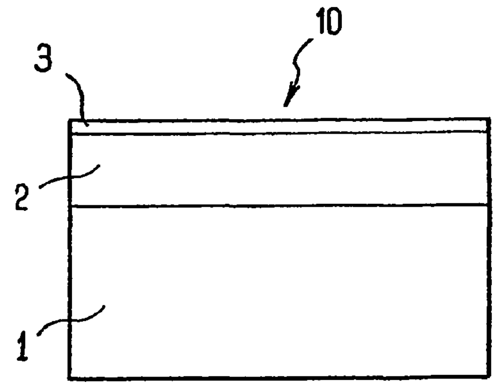
FIG_1b
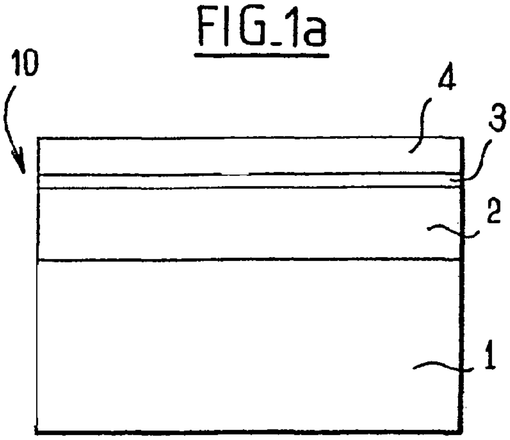
FIG_1c
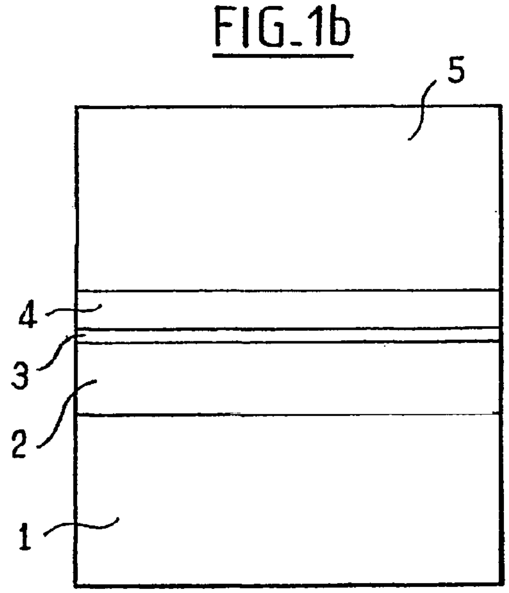
FIG_1d
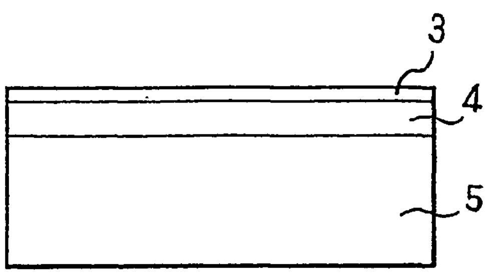
FIG_1e
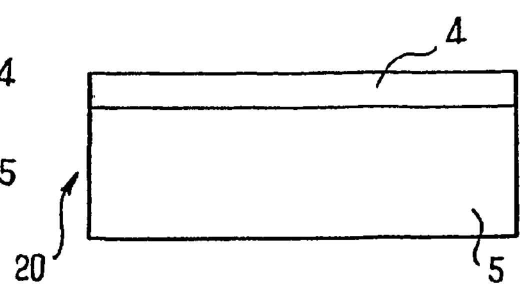
FIG_1f

METHODS FOR TRANSFERRING A THIN LAYER FROM A WAFER HAVING A BUFFER LAYER

CROSS-REFERENCE TO RELATED APPLICATIONS

This application is a continuation of International application PCT/IB03/03466 filed on Jul. 9, 2003, the entire content of which is expressly incorporated herein by reference thereto.

BACKGROUND ART

The present invention relates to methods for transferring thin layers from a wafer to a receiving substrate, to form structures such as a semiconductor-on-insulator (SOI) structures.

The goal of transferring thin layers is typically to produce electronic structures having an active layer, which is the layer that includes or will include the electronic components, that is thin and homogeneous throughout its thickness. A second goal is to produce such structures by transferring the active layer onto a receiving substrate from a wafer having a buffer layer. Such a process may provide the possibility of reusing part of the wafer, in particular at least part of the buffer layer, for another transfer process.

The term "buffer layer" means a layer having a different lattice parameter than that of adjacent layers. The buffer layer is generally an intermediate layer between two crystallographic structures with different lattice parameters. The buffer layer has in the region of one of its faces a lattice parameter that is substantially identical to that of the first structure, and in the region of its other face a lattice parameter that is substantially identical to that of the second structure. For example, a wafer may include a single-crystal silicon (also called Si) wafer and a relaxed layer of silicon-germanium (SiGe) with a buffer layer therebetween, which permits forming the SiGe layer on the Si wafer despite the difference in lattice parameter of these two materials.

A "relaxed layer" is a layer of semiconductor material having a crystallographic relaxation rate, as measured by X-ray diffraction or Raman spectroscopy, in excess of 50%. A layer with a 100% relaxation rate has a lattice parameter substantially identical to the nominal lattice parameter of the material of the layer, and thus the lattice parameter of a material in bulk form is in equilibrium.

Conversely, the term "strained layer" means any layer of a semiconductor material whose crystallographic structure is strained by being in tension or in compression during crystal growth, such as during epitaxial growth. This requires at least one lattice parameter of the layer to be substantially different from the nominal lattice parameter of the material.

A buffer layer makes it possible to grow a SiGe layer on a Si substrate without the SiGe layer being strained by the Si substrate. Given that bulk SiGe is usually not available on the market, the use of a buffer layer of a wafer to obtain a relaxed SiGe layer on the surface makes it possible to produce a structure which can satisfy the same functions as a bulk SiGe substrate. The buffer layer that is inserted between the Si wafer and the relaxed SiGe layer is generally made of SiGe, having a quantity of germanium which progressively increases through the thickness of the wafer towards the relaxed layer. Thus, a silicon-germanium buffer layer can be referred as a $Si_{1-x}Ge_x$ buffer layer, the x parameter representing the germanium concentration in the buffer layer increasing progressively from 0 to r. The relaxed SiGe layer on the surface of the $Si_{1-x}Ge_x$ buffer layer is thus referred as the relaxed $Si_{1-x}Ge_x$ layer, wherein the r parameter represents the germanium concentration in the relaxed layer.

Thus, the $Si_{1-x}Ge_x$ buffer layer makes it possible to gradually increase the germanium content x from the wafer (x=0) towards the relaxed layer (x=r), and to confine defects associated with the difference in lattice parameter so that they are buried. In addition, the $Si_{1-x}Ge_x$ buffer layer makes it possible to give a sufficiently thick relaxed $Si_{1-r}Ge_r$ layer stability with respect to a film of different material epitaxially grown on its surface to strain the latter to modify its lattice parameter without influencing that of the relaxed $Si_{1-r}Ge_r$ layer. For all of these reasons, the buffer layer must be sufficiently thick and typically has a value greater than one micron. Controlling the germanium concentration within a relaxed SiGe layer makes it possible to control its lattice parameter and thus to control the strain exerted on a film that is epitaxially grown on the relaxed SiGe layer.

Processes for transferring a layer of relaxed material that is epitaxially grown on such a buffer layer from the wafer on to a receiving substrate are known. Such processes are, for example, proposed in an IBM document by L. J. Huang et at. "SiGe-On-Insulator prepared by wafer bonding and layer transfer for high-performance field-effect transistors", Applied Physics Letters, Feb. 26, 2001, Vol. 78, No. 9) and in U.S. Pat. No. 5,906,95 1. In these publications, a Silicon-Germanium-On-Insulator (SGOI) structure is produced from a wafer that includes in succession a single-crystal Si support substrate, a SiGe buffer layer and a relaxed SiGe layer.

Another process described in a document by L. J. Huang et at. consists of carrying out a SMART-CUT® process, known to those skilled in the art, to remove the relaxed SiGe layer so as to transfer it by bonding to an oxidized receiving substrate to produce a SGOI structure. Descriptions of the SMART-CUT® process can be found in a number of works concerning wafer reduction techniques. Despite the advantages that this process affords, a few rough areas may formed on the surface of the transferred layer and thus a surface finishing step would then have to be conducted. The finishing step is generally carried out by using CMP (chemical-mechanical polishing or chemical-mechanical planarization), which may create surface defects (such as strain-hardened regions). Using CMP may not correct the thickness perfectly, and thus an inhomogeneous layer thickness may be retained that may impede the transfer of the SiGe layer, and thus increase costs.

The process presented in U.S. Pat. No. 5,906,951 includes, in addition to a CMP polishing step, preliminary lapping, polishing and etching steps in order to remove part of the wafer. These steps slow down the overall removal process and increase costs even further, and do not ensure good layer thickness homogeneity. The first goal for using a transfer process mentioned above is therefore not adequately achieved.

In an attempt to alleviate the problem, U.S. Pat. Nos. 5,882,987 and 6,323,108 disclose an overall process for producing SOI (silicon-on-insulator) structures from a wafer that includes in succession a single-crystal Si support substrate, an SiGe layer and an epitaxially grown Si layer bonded to an oxidized receiving substrate. The SMART-CUT® technique is employed and, after bonding the wafer to a receiving substrate, part of the wafer is detached at the Si support substrate. A structure that consists in succession of part of the Si support substrate, the SiGe layer and the epitaxially grown Si layer is thus removed, and the whole assembly is bonded to the oxidized receiving substrate. Two successive selective etching operations are then conducted on the structure. The first removes the remaining part of the Si support substrate with an etching solution such that the SiGe layer forms a stop layer, and the second removes the SiGe layer with an etching solution such that the Si layer forms a stop layer. The resulting structure is an SOI structure with a Si surface layer.

Thus, an SeOI structure is obtained with a semiconductor layer which is both thin and uniform throughout its thickness, substantially identical to the epitaxially grown initial layer, and the process avoids using a finishing step other than a selective etching operation. However, the SiGe layer inserted between the Si wafer and the epitaxially grown Si layer has a typical thickness of between 0.01 and 0.2 microns. This thickness is insufficient, as mentioned above, to fulfill the role of a buffer layer between the Si wafer and a relaxed layer of a different semiconductor material, such as a relaxed SiGe layer. The wafer therefore does not include a buffer layer, and therefore the second goal mentioned above concerning the transfer process is not achieved. In addition, given the order of magnitude of the thickness of the inserted SiGe layer, the state of the resulting structure does not seem defined with certainty.

Another main objective of the transfer relates to producing a final structure including one or more layers in substantially controlled structural states, such as a substantially relaxed SiGe layer. This objective does not seem to be guaranteed by the structure production process described in the document U.S. Pat. No. 6,323,108. PCT Application No. WO 01/99169 provides processes for producing, from a wafer consisting successively of an Si substrate, an SiGe buffer layer, a relaxed SiGe layer and optionally a strained Si or SiGe layer, a final structure with the relaxed SiGe layer on the optional other strained Si or SiGe layer. The technique employed for producing such a structure involves, after bonding the wafer to a receiving substrate, removal of the undesired material of the wafer, by selectively etching the Si substrate and the SiGe buffer layer. Although this technique does make it possible to achieve particularly small layer thicknesses that are homogeneous throughout the layer thickness, it entails destroying the Si substrate and the SiGe buffer layer by chemical etching. These processes therefore do not allow reuse of part of the wafer, and especially at least part of the buffer layer, for further transfers of layers. Thus, the third objective of using a transfer process of obtaining a reusable wafer portion is not achieved.

PCT Application No. WO 02/15244 describes a source wafer, provided before transfer, that includes a relaxed SiGe layer, a strained Si/SiGe layer, a buffer SiGe layer, and a Si substrate structure. A SMART-CUT® process is used at the strained Si layer level to conduct the transfer. But implanting ions in the strained layer of Si can be difficult due to the thickness of such a layer, and can thus lead to creating structural damage in the SiGe layers surrounding it.

Thus, improvements in achieving these objectives are desired and these are now provided by the present invention.

SUMMARY OF THE INVENTION

The present invention relates to methods for transferring a layer of semiconductor material from a wafer, wherein the wafer includes a support substrate and an upper surface that includes a buffer layer of a material having a first lattice parameter. In one embodiment, the method includes growing a strained layer on the buffer layer. The strained layer is made of a semiconductor material having a nominal lattice parameter that is substantially different from the first lattice parameter, and it is grown to a thickness that is sufficiently thin to avoid relaxation of the strain therein. The method includes growing a relaxed layer on the strained layer. The relaxed layer is made of silicon and includes a concentration of at least one other semiconductor material so that the layer has a nominal lattice parameter that is substantially identical to the first lattice parameter of the buffer layer. The method also includes providing a weakened zone in the buffer layer, and supplying energy to detach a structure at the weakened zone. The detached structure includes a portion of the buffer layer, the strained layer and the relaxed layer. Furthermore, the method includes enriching the concentration of the at least one other semiconductor material in the relaxed layer of the structure.

Advantageously, the enriching step includes oxidizing the buffer layer of the detached structure to form an oxide layer, and increasing the concentration of the other semiconductor material in a region of the relaxed layer in that is adjacent the oxide layer. In addition, the detached structure may be heat treated to homogenize the oxygen concentration within the oxide layer. In a variation, the method includes deoxidizing the detached structure to remove the oxide layer. The detached structure may be heat treated to homogenize the oxygen concentration within the oxide layer, with the heat treatment being conducted either before or after deoxidizing. The method advantageously includes bonding a receiving substrate to the relaxed layer. The receiving substrate may be made of silicon, and before bonding, at least one bonding layer may be formed on at least one of the receiving substrate or the relaxed layer. Beneficially, the bonding layer is made of an electrically insulating material, such as silica that is formed by oxidation.

In an advantageous embodiment, the method includes providing the weakened zone by implanting species into the buffer layer at a predetermined implantation depth. In a variant, a porous layer is provided as the weakened zone prior to growing the relaxed layer. Advantageously, the method includes conducting at least one selective etching operation on the detached structure. The buffer layer may be selectively etched. In addition, after etching and before enriching, the method may include growing a semiconductor layer on the strained layer wherein the semiconductor layer is made of a semiconductor material that has substantially the same lattice constant as that of the strained layer. If desired, the strained layer may be oxidized, and the wafer may be annealed during or following the oxidizing to strengthen bonding of the layers.

In a preferred embodiment, the method further includes, after enriching, growing a further layer on the relaxed layer. Advantageously, the layer grown on the relaxed layer is of a strained material. In an advantageous implementation, the buffer layer is made of silicon-germanium and has a germanium concentration that increases through its thickness and includes a buffer relaxed layer. When the strained layer is made of silicon and the second semiconductor material is germanium, the relaxed layer is made of substantially relaxed silicon-germanium having a germanium concentration substantially equal to the germanium concentration of the buffer relaxed layer. Alternatively, the other semiconductor material in the relaxed layer may be carbon or an alloy of germanium-carbon and a strained silicon layer may be provided on the relaxed layer to substantially preserve the lattice parameter of the relaxed layer. In a beneficial implementation, the wafer further includes at least one layer containing carbon with a carbon concentration of at least one of substantially less than or equal to about 50% or substantially less than or equal to about 5%. The process may be used to form at least one of the following preferred semiconductor on insulator structures: SGOI, strained Si /SGOI, SiGe /strained Si/SGOI, or $SiO_2$/SGOI.

Beneficially, the invention permits controlling of the different structural states (strain or relaxation rates) of the various layers that comprise the final structure (such as a relaxed SiGe layer). More particularly, the present techniques according to the invention allow the restrictions that limit current techniques to approximately 30% the concentration r of germanium within the relaxed $Si_{1-r}Ge_r$ layer on the surface of the $Si_{1-x}Ge_x$ buffer layer to be exceeded.

BRIEF DESCRIPTION OF THE DRAWINGS

Other aspects, purposes and advantages of the invention will become clear after reading the following detailed description with reference to the attached drawings, in which:

FIGS. 1*a*, 1*b*, 1*c*, 1*d*, 1*e* and 1*f* show the various steps of a method of producing an electronic structure comprising a thin SiGe layer according to the invention.

DETAILED DESCRIPTION OF THE PREFERRED EMBODIMENTS

Figure 2A:
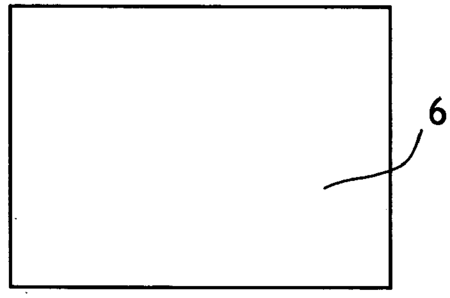
FIGS. 2*a*, 2*b*, 2*c* and 2*d* show the various steps of a treatment applied to a layer made of a semiconductor material that includes silicon and at least another element in order to enrich the layer in the other element.

In a first aspect, a structure is produced that includes a thin layer of semiconductor material obtained from a wafer. The wafer includes a lattice parameter buffer layer having an upper layer of a material chosen from semiconductor materials having a first lattice parameter. The process includes growing a film on the upper layer of the buffer layer, wherein the film is of a material having a nominal lattice parameter that is substantially different from the first lattice parameter. The film also has a thickness that is sufficiently thin to be strained. The process also includes growing a relaxed layer of a material chosen from semiconductor materials including silicon and at least another material, and having a nominal lattice parameter substantially identical to the first lattice parameter. Next, a part of the wafer is removed by forming a weakened zone in the buffer layer and then supplying energy to detach the part of the wafer including the relaxed layer at the weakened zone. The technique also includes enriching the other material of the relaxed layer.

The method may also include one or more of the following items. The enrichment step can employ an oxidation operation on the detached part of the wafer to form an oxide layer on the surface of the oxidized detached part of the wafer, and to increase the concentration of the element other than silicon in a region of the relaxed layer which is subjacent the oxide layer. The enrichment step may also include a deoxidation operation for removing the oxide layer. In addition, the enrichment step may include a heat treatment operation to homogenize the concentration of the element other than silicon within the oxidized part of the wafer. The heat treatment operation can be carried out after the oxidation operation, and either before or after the deoxidation operation. The heat treatment operation is preferably conducted at a temperature of approximately 1200° C.

Furthermore, after the growth step, an additional step may be conducted in which a receiving substrate is bonded to the relaxed layer, and in this case, the receiving substrate is made of silicon. In either of these latter two cases, before bonding, a step may be conducted to form at least one bonding layer between the receiving substrate and the wafer, wherein the bonding layer is formed on the receiving substrate and/or on the bonding face of the wafer. In the latter case, the bonding layer is an electrically insulating material such as silica.

The weakened zone may be formed by implanting species into the buffer layer at a depth substantially equal to a predetermined implant depth. In a variant, before the growth step, the weakened zone is formed by providing a porous layer beneath the relaxed layer. Preferably, the removal step includes at least one selective etching operation. The selective etching operation relates to the etching of the remaining part of the buffer layer with respect to the film (after detachment of the wafer by energy supply). After the etching operation and before the enrichment step, another film of a semiconductor material may be grown, and it may be oxidized. An annealing treatment may be used at the same time or following the oxidation step, and this annealing treatment is operable to strengthen the bonding interface. In the latter case, a selective etching operation relates to the etching of the film with respect to the relaxed layer;

The process may furthermore include, after the removal step, growing a layer on the relaxed layer. In this case, the growth layer on the relaxed layer is made of strained material. The buffer layer may be made of silicon-germanium (wherein the buffer layer includes a layer with a germanium concentration which increases through the thickness and a relaxed layer beneath the film). The film of strained material is made of silicon, the element other than silicon is germanium so that the relaxed layer is made of substantially relaxed silicon-germanium (with a germanium concentration substantially equal to the germanium concentration of the relaxed layer of the buffer layer). The element other than silicon in the relaxed layer may also be carbon or an alloy germanium-carbon. In these latter cases, the growth layer produced on the relaxed layer is made of strained silicon so as to substantially preserve the lattice parameter of the subjacent relaxed silicon-germanium layer. The wafer may include at least one layer that contains carbon with a carbon concentration in the layer substantially less than or equal to 50%. In an implementation, the wafer comprises at least one layer that contains carbon with a carbon concentration in the layer substantially less than or equal to 5%.

According to another aspect, the invention provides a structure, obtained as indicated by the method proposed by the first aspect after a bonding step with a receiving substrate and the enrichment step. The structure includes in succession at least a receiving substrate and the relaxed layer in the detached part of the wafer and having an enriched element other than silicon. The relaxed layer has a lattice parameter substantially superior to said the first lattice parameter.

According to a third aspect, the invention provides an application of the method of the first aspect of the invention to produce one of the following "semiconductor on insulator" structures: SGOI, strained Si/SGOI, SiGe/strained Si/SGOI, $SiO_2$/SGOI.

An embodiment of a method according to the invention will now be described in detail. FIG. 1*a* shows a wafer 10 consisting of a single-crystal silicon support substrate 1 and a lattice parameter matching layer 2 or buffer layer made of a semiconductor material of silicon and at least another element. The expression "lattice parameter matching layer" denotes any structure behaving as a buffer layer and having, on the surface, a layer of substantially relaxed material without an appreciable number of structural defects, such as dislocations. In this example, it will be advantageous to choose a lattice parameter matching layer 2 made of a semiconductor material comprising silicon and germanium.

The SiGe lattice parameter matching layer 2 or buffer layer consists successively of a $Si_{1-x}Ge_x$ buffer layer, wherein the concentration x of germanium within the buffer layer progressively increases from 0 to r, and a relaxed $Si_{1-r}Ge_r$ layer on the surface of the $Si_{1-x}Ge_x$ buffer layer. The buffer layer preferably has a germanium concentration x which grows uniformly from the interface with the support substrate 1, for reasons which were explained above. Its thickness is typically between 1 and 3 micrometers to obtain good structural relaxation on the surface.

The relaxed $Si_{1-r}Ge_r$ layer has advantageously been formed by epitaxy on the surface of the buffer layer. Its thickness may vary widely depending on the case, with a typical thickness of between 0.5 and 1 micron. The germanium present in the silicon at a concentration r within the relaxed $Si_{1-r}Ge_r$ layer makes it possible to grow a strained Si film 3 layer on the relaxed $Si_{1-r}Ge_r$ layer during the next step (shown in FIG. 1*b*).

The cost of a buffer layer is generally very important, and its quality is difficult to control once the maximum concentration of germanium within a $Si_{1-x}Ge_x$ buffer layer becomes high. Indeed, current techniques limit the concentration r of germanium within the relaxed $Si_{1-r}Ge_r$ layer on the surface of the SiGe buffer layer 2 to approximately 30%. Thus, the constraint exerted on the Si film 3 grown on the buffer layer 2 is also limited.

With reference to FIG. 1*b*, a Si film 3 is grown on the SiGe buffer layer 2. In a first case, the film 3 is grown in situ, directly continuing from the formation of the subjacent buffer layer 2, the latter also being in this case advantageously formed by layer growth. In the second case, the film 3 is grown after a gentle finishing step is conducted on the surface of the subjacent buffer layer 2, for example by CMP polishing.

The Si film 3 is advantageously formed by epitaxy using techniques such as CVD (chemical vapor deposition) and MBE (molecular beam epitaxy) techniques. The silicon of the film 3 is then obliged by the buffer layer 2 to increase its nominal lattice parameter in order to make it substantially identical to that of its growth substrate and thus introduce internal tensile strains. It is necessary to form quite a thin Si film 3 because too great a film thickness would cause the strain in the thickness of the film to relax towards the nominal lattice parameter of the silicon and/or defects to be generated in the film 3. The thickness of the film 3 is thus typically less than 200 angstroms in order to avoid any relaxation of the strain therein.

Referring to FIG. 1*c*, a relaxed SiGe layer 4 is grown on the strained Si film 3, advantageously by epitaxy (for example by CVD or MBE). This relaxed SiGe layer is produced either in situ, immediately after growth of the subjacent film 3, or after a gentle finishing step carried out on the surface of the subjacent film 3, such as a CMP polishing step. The germanium concentration in this layer 4 is substantially the same as that present near the bonding face of the buffer layer 2 (that is to say a concentration r of Ge), so as to keep the nominal matching parameter of the relaxed $Si_{1-r}Ge_r$ layer present at this level in the buffer layer 2 and preserved in the strained Si film 3. The thickness of this relaxed SiGe layer 4 may be from about a few tens to about a few hundreds of nanometers, preferably between about 10 and about 100 nanometers.

With reference to FIG. 1*d*, a receiving substrate 5 is advantageously bonded to the relaxed SiGe layer 4. This receiving substrate 5 may be, for example, made of silicon or may consist of other types of materials. The receiving substrate 5 is bonded by bringing it into contact with the relaxed layer 4, advantageously effecting molecular adhesion (wafer bonding) between the substrate 5 and the layer 4. This bonding technique, as well as variants, is described in the document entitled "Semiconductor Wafer Bonding ", Science and Technology, Interscience Technology, by Q. Y. Tong, U. Gösele and Wiley. If necessary, the respective surfaces to be bonded are treated before bonding by use of an appropriate prior treatment and/or may be treated by supplying thermal energy and/or by supplying an additional bonding layer. Thus, for example, a heat treatment carried out during bonding allows the bonds to be strengthened. Bonding may also be reinforced by inserting a bonding layer between the layer 4 and the receiving substrate 5, which makes it possible to produce molecular bonds both with the layer 4 and with the material making up the bonding face of the receiving substrate 5 which are at least as strong as those existing between the layer 4 and the receiving substrate 5. Silicon oxide (also called silica or $SiO_2$) is a material that may be chosen for producing such a bonding layer. The silica may be formed on the relaxed layer 4 and/or on the receiving substrate 5, by $SiO_2$ deposition or by thermal oxidation on the respective bonding surfaces.

Advantageously, the material of the bonding face of the receiving substrate 5 and/or the material of the optionally formed bonding layer is electrically insulating, to result in producing an SeOI structure 20, the semiconductor layer of the SeOI structure then being the transferred relaxed layer 4. Once the receiving substrate 5 has been bonded to the relaxed layer, part of the wafer 10 is removed in order to transfer the relaxed SiGe layer 4 onto the receiving substrate 5 and thus produce the desired structure 20. Substantially all of the portion of the wafer 10 on the side of the buffer layer 2 opposite to the relaxed SiGe layer 4 is removed. With reference to FIGS. 1*e* and 1*f*, this material removal process is carried out in two steps.

A first removal step is shown in FIG. 1*e*, wherein substantially the entire part of the wafer 10 on the buffer or buffer layer 2 side is removed. To do this, a first material removal operation consists of detaching the donor wafer in a region of the buffer layer 2 that has been weakened beforehand in this region.

Two known techniques may be used to conduct such an operation, which techniques are described herein as non-limiting examples. The first technique, called the SMART-CUT® technique, is known to those skilled in the art (and descriptions may be found in a number of works dealing with wafer reduction techniques). This technique includes implanting atom species (such as hydrogen ions) and then subjecting the implanted region, which forms a weakened zone, to a heat treatment and/or to a mechanical treatment or another supply of energy, in order to detach the buffer layer 2 in the weakened zone. Detachment in the weakened zone makes it possible to remove most of the wafer 10, in order to obtain a structure comprising the remainder of the buffer layer 2, the strained Si film 3, the relaxed SiGe layer 4, the optional bonding layer and the receiving substrate 5.

A second technique consists of obtaining a weak interface by creating at least one porous layer, as described for example in U.S. Pat. No. 6,100,166, and then subjecting the weak layer to a mechanical treatment, or another supply of energy, in order to detach in the weakened layer. The weakened layer made of porous silicon is formed within the support substrate 1, between the support substrate 1 and the buffer layer 2, or within the buffer layer 2 (for example between a buffer layer and a relaxed layer) or on the buffer layer 2 (that is to say between the buffer layer 2 and the strained Si film 3).

To form a weakened layer within the support substrate 1, the porous layer is advantageously formed on a single-crystal Si wafer and then a second growth is carried out on the porous layer to grow a non-porous Si layer having substantially the same lattice parameter as the Si of the wafer. The support substrate 1 then consists of the wafer, the porous layer and the non-porous Si layer. Detachment at the weakened layer makes it possible to remove at least some of the wafer 10, in order to obtain a structure including the optional remainder of the wafer 10, the strained Si film 3, the relaxed SiGe layer 4, the optionally inserted bonding layer and the receiving substrate 5.

A treatment of the wafer 10, in order to remove the porous silicon which remains after detachment, is advantageously carried out, such as by using an etching operation or a heat treatment. If the porous layer lies within the support substrate 1, a lapping, chemical-mechanical polishing and/or a selective chemical etching operation may then be advantageously carried out in order to remove the remaining part of the support substrate 1.

These two non-limiting techniques make it possible to rapidly remove, en bloc, a substantial part of the wafer 10. They also allow permit reuse of the removed portion of the wafer 10 in another process, such as another process according to the invention. Thus, if the removed part is the support substrate 1, an operation to reform a buffer layer 2, a film 3 and a relaxed layer 4 may be carried out as described above, after the surface of the support substrate 1 has been polished.

A second material removal operation may be conducted after detaching the wafer 10 according to, for example, one of the above two techniques. This may consist of removing, if necessary, the remaining part of the buffer layer 2. This operation may be carried out by selective chemical etching so that the strained Si film 3 undergoes little or no etching, thus forming an etching stop layer. In this case, the remaining part of the buffer layer 2 is etched by wet etching using etch solutions that are substantially selective with respect to the strained Si film 3, such as a solution comprising $HF/H_2O_2/CH_3COOH$ (approximately 1/1000 selectivity) or H NA (hydrofluoric-nitric-acetic solution).

Dry etching operations may also be conducted in order to remove material, such as plasma etching, or sputtering. Chemical methods have the main advantage of rapidly removing thin layers while avoiding the use of chemical-mechanical polishing finishing operations that are typically used after the detaching step. However, a chemical etching operation may advantageously be preceded, especially when a thicker layer is to be removed, by mechanical or chemical-mechanical abrasion using a lapping and/or chemical-mechanical polishing CMP technique on the remaining part of the buffer layer 2. These techniques are proposed by way of an example, but are not to be construed as limiting the invention as many types of techniques would be suitable for removing material from a wafer 10 in accordance with the process according to the invention.

A first application of the invention concerns preserving the film 3, at least partially, in order to produce a strained Si/SGOI structure. Optionally, a Si layer may be grown on the film 3 to make it thicker. The strained layer obtained after such a growth process should remain below the critical thickness to avoid relaxing the strain. Because the last step of etching the remaining part of the buffer layer 2 may damage or thin the film 3, an advantage of thickening the film 3 is to regain the initial thickness, or to obtain a more important thickness (that is still below the critical thickness). This thick strained Si layer can then be used as an active layer (thus taking advantage of the high electron mobility that a such material exhibits).

The strained Si of the film 3, which has been thickened or not, may optionally be at least oxidized. The oxidation step can be used to encapsulate the underlying layer of SiGe, to avoid Ge diffusion. A second advantage results if an additional annealing step is implemented which is that the bond at the bonding interface is strengthened. Other advantages, for example, an improvement of the film 3 quality may also result. Indeed, a bonding annealing step is generally conducted within a range of temperatures that can create some faults in the structure such as pinholes. As described in U.S. Pat. No. 6,403,450, the presence of a $SiO_2$ layer on a semiconductor layer avoids most of the problems that can occur during annealing. Using the Si material of film 3 as the oxidizing material is advantageous as Si is industrially easier to oxidize than SiGe material.

In an embodiment, an enrichment step is used on top of the structure to enrich the germanium of the relaxed SiGe layer 4 underneath the Si film 3. As mentioned above, the concentration of germanium within the relaxed SiGe layer 4 is substantially the same as that present in the relaxed $Si_{1-r}Ge_r$ layer on the surface of the SiGe lattice parameter matching buffer layer 2. Since r is limited to 30% due to the limitations of current SiGe buffer layer production techniques, the concentration of germanium within the relaxed SiGe layer 4 is limited.

The affinity of Germanium with oxygen is weaker than that of silicon with oxygen. Consequently, when a SiGe layer is exposed to an oxidizing atmosphere, silicon within the SiGe layer oxidizes while germanium within the SiGe layer does not react directly with oxygen. Thus, the oxidation of a SiGe layer conducted using most known oxidation methods results in the silicon oxidizing (forming a silicon oxide layer, also called silica or $SiO_2$), while the germanium atoms, released by the oxidation of silicon, migrate and accumulate at the $SiO_2$/SiGe interface. As explained above, as Si is industrially easier to oxidize than SiGe, a Si layer on top of a SiGe layer (such as the Si film 3 on top of the relaxed SiGe layer 4) can help to initiate oxidation of a SiGe layer. The result is that a layer rich in germanium (enriched layer) is formed under the oxide layer, and the enriched layer contains silicon when oxidation ceases before silicon is completely oxidized. A non oxidized layer of SiGe, and thus of unchanged germanium concentration, remains under the aforementioned enriched layer, as the germanium atoms are mainly aggregated at the $SiO_2$/SiGe interface, and not redistributed in the totality of the Si crystal. A structure made of an oxide layer, a $Si_{1-z}Ge_z$ layer and generally a $Si_{1-r}Ge_r$ layer is therefore obtained. The term r represents the initial germanium concentration within the SiGe layer oxidized in this manner, and z represents the germanium concentration within the enriched layer, wherein z is higher than x.

The FIGS. 2*a*, 2*b*, 2*c* and 2*d* illustrate enrichment of germanium of a $Si_{1-r}Ge_r$ layer 6. The enrichment step of such a layer 6 comprises oxidation of the $Si_{1-r}Ge_r$ layer 6, possibly followed by a deoxidation step to remove the oxide layer formed during the oxidation operation. A heat treatment operation can also be conducted to homogenize the concentration of germanium within the enriched layer.

In an implementation, the oxidation operation is a classical oxidation process known to those skilled in the art. Preferably, the oxidation operation is conducted at a temperature ranging from between about 700° C. to about 1100° C. It can be conducted by using a dry or a wet process. Using a dry process, for example, oxidation is conducted by heating the substrate under gas oxygen. An example of a suitable wet process comprises oxidizing by heating the substrate in an atmosphere charged with steam.

Figure 2B:
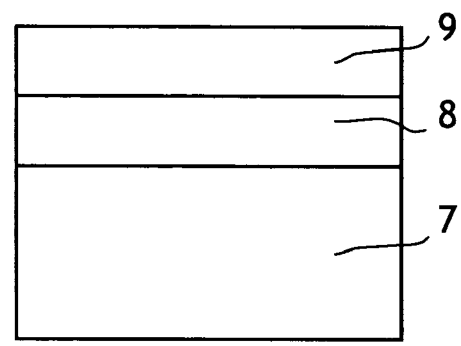

Following the oxidation operation, as shown in FIG. 2*b*, a surface oxide layer 9 is formed and a $Si_{1-z}Ge_z$ layer 8 enriched in germanium (z being higher than r) is underneath the oxide layer 9. The oxide layer 9 includes mainly silica ($SiO_2$), but a composite SiGe oxide ($Si_yGe_tO_2$) can be also formed. The composite SiGe oxide may be formed depending on various parameters, for example, the oxidation operation conditions, the initial concentration r of germanium within the $Si_{1-r}Ge_r$ layer 6, or the initial thickness of the $Si_{1-r}Ge_r$ layer 6. Thus, for example, a low temperature wet oxidation operation results in forming such a SiGe oxide ($Si_yGe_tO_2$). As stated previously, if the oxidation operation takes effect only in a near surface area of the $Si_{1-r}Ge_r$ layer 6, then a non oxidized $Si_{1-r}Ge_r$ layer 7 having an unchanged germanium concentration is found under the enriched $Si_{1-z}Ge_z$ layer 8.

Figure 2C:
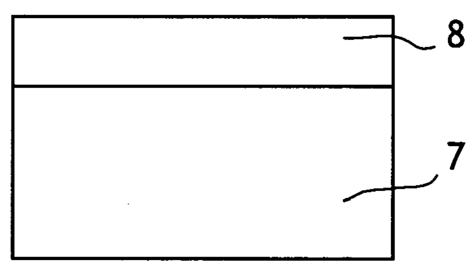
Figure 2D:
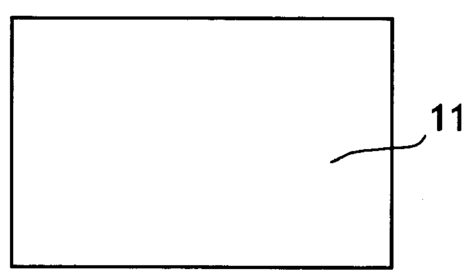

The deoxidation operation is conducted to remove the oxide layer 9 formed during the oxidation operation. Deoxidation is preferably conducted in a traditional manner. For this purpose, the substrate can be plunged into a solution of hydrofluoric acid of 10% or 20% concentration, for example, for a few minutes. As represented in FIG. 2*c*, a structure made up of the enriched $Si_{1-z}Ge_z$ layer 8 and possibly of the $Si_{1-r}Ge_r$ layer 7 having an unchanged germanium concentration, can be obtained after the deoxidation operation.

Advantageously, the enrichment step comprises a heat treatment operation to allow the redistribution of the germanium atoms in the crystal of the Si. Thus, the heat treatment step is adapted for obtaining a SiGe layer that is enriched in germanium and has a homogeneous germanium concentration. In an implementation, the heat treatment operation is conducted at a temperature of approximately 1200° C. The heat treatment operation is conducted after the oxidation step and preferably prior to the deoxidation step. However, the heat treatment operation can also be carried out after both of the oxidation and deoxidation steps.

In one embodiment, the enrichment step does not comprise a deoxidation operation. Thus, the enriched SiGe layer is encapsulated by an oxide layer to avoid, as mentioned above, Ge diffusion from it.

FIGS. 2*a* to 2*d* illustrate an enrichment process including an oxidation operation, a deoxidation operation, and a heat treatment operation. An enriched $Si_{1-k}Ge_k$ layer 11 (FIG. 2*d*) of homogeneous concentration k in germanium is thus formed, wherein k is between the initial concentration r of the initial $Si_{1-r}Ge_r$ layer 6 and the concentration of the enriched $Si_{1-z}Ge_z$ layer 8. Finally, a light polishing step, preferably a chemical-mechanical polishing (CMP) process, can be conducted to decrease the surface roughness and to improve the thickness uniformity of the enriched $Si_{1-k}Ge_k$ layer 11. Several enrichment steps can be conducted successively to control, and to significantly increase, the germanium concentration within the treated SiGe layer. Thus, due to such an enrichment step, the concentration of germanium within the SiGe layer 4 (underneath the Si film 3 before the enrichment step; see FIG. 1*e*) can be increased, and more particularly can exceed the typical 30% limitation. The increased germanium concentration can indeed reach 80% and is generally about 50%.

A second aspect of the invention implies, prior to any enrichment step, a removal of the film 3 by using a chemical process, as shown in FIG. 1*f*. To accomplish this, selective etching is preferably used that employs an etch solution exhibiting high selectivity with respect to the relaxed SiGe layer 4, such as a solution comprising at least one of the following compounds: KOH (potassium hydroxide), $NH_4OH$ (ammonium hydroxide), TMAH (tetramethylammonium hydroxide), EDP (ethylenediamine/pyrocatechol/pyrazine) or $HNO_3$, or solutions currently under study combining agents such as $HNO_3$, $HNO_2H_2O_2$, HF, $H_2SO_4$, $H_2SO_2$, $CH_3COOH$, $H_2O_2$ and $H_2O$, as explained on page 9 of PCT Application No WO 99/53539.

This second step makes it possible to retain good surface quality and good thickness homogeneity of the relaxed SiGe layer 4. Thus, a layer quality that is substantially identical to that obtained during its growth (shown in FIG. 1*c*) is retained. This is because the transferred layer 4 has not necessarily been subjected to external mechanical stresses, such as those generated by a CMP finishing step. The appearance of defects associated with such stresses are therefore avoided. However, in certain cases, soft polishing is conducted to remove any slight surface roughness. Thus, a final relaxed SiGe-on-substrate structure is obtained, and in particular a relaxed SiGe-on-insulator structure (also called an SGOI structure) if the subjacent material of the relaxed SiGe layer 4 is an electrical insulator.

In a particular embodiment of the second aspect, an enrichment step can be conducted on the final relaxed SiGe-on-substrate structure. As explained above, such an enrichment step allows one to increase the germanium content within the relaxed SiGe layer 4 formed on top of the SiGe-on-substrate structure. In another embodiment, any epitaxy process may be conducted on the relaxed SiGe layer, such as epitaxial growth of another SiGe layer or of a strained Si layer. In the latter case, an Si/SGOI final structure is obtained, wherein the Si layer is strained.

It should be noted that, when the structure has been subjected to one or more enrichment steps, the germanium concentration within the final relaxed SiGe layer is increased and can exceed the typical 30% limitation. Hence, the enrichment step helps to control the germanium concentration within the final relaxed SiGe layer, and thus the lattice parameter of such a layer. Finally, the strain exerted on a film that is epitaxially grown on the relaxed SiGe layer can also be controlled. In particular, a Si/SGOI final structure can be obtained, wherein the Si film is strained.

Having completed the final structure, an optional finishing step may be used. For example, a heat treatment may be conducted to further strengthen the bonding interface with the receiving substrate 5.

The present invention is not limited to an SiGe lattice parameter matching buffer layer 2, but also extends to a buffer layer 2 made from other types of semiconductor type III–V materials or other materials capable of straining the material of the epitaxially grown film 3. Likewise, the present invention is not limited to a film 3 of strained Si, but also may encompass a film made of other types of semiconductor III–V materials or other materials capable of being strained by the underlying buffer layer 2. Regarding the semiconductor layers, other constituents may be added thereto, such as carbon with a carbon concentration in that layer that is substantially less than or equal to 50% or more, and in particular with a concentration of less than or equal to 5%.

In addition, and similarly to what was described previously for the germanium enrichment of a SiGe layer, as silicon Si also oxidizes selectively to carbon C, layers of semiconductor materials such as SiGeC alloys or Si1-yCy alloys, y being weak, can be enriched in their component carbon by oxidation.

Lastly, the present invention does not relate only to transferring a relaxed SiGe layer 4, but in general relates to transferring a layer of any type of semiconductor material that is capable of being transferred according to the described processes.

What is claimed is:

1. A method for transferring a layer of semiconductor material from a wafer that comprises a support substrate and an upper surface that includes a buffer layer of a material having a first lattice parameter, which method comprises:

growing a strained layer on the buffer layer, wherein the strained layer is made of a semiconductor material having a nominal lattice parameter that is substantially different from the first lattice parameter and is grown to a thickness that is sufficiently thin to avoid relaxation of the strain therein;

growing a relaxed layer on the strained layer, wherein the relaxed layer comprises silicon and a concentration of at least one other semiconductor material and the relaxed layer has a nominal lattice parameter that is substantially identical to the first lattice parameter of the buffer layer;

providing a weakened zone in the buffer layer and supplying energy to detach, at the weakened zone, a structure comprising a portion of the buffer layer, the strained layer and the relaxed layer; and enriching the concentration of the at least one other semiconductor material in the relaxed layer of the structure.

2. The method of claim 1, wherein the enriching comprises oxidizing the buffer layer of the detached structure to form an oxide layer and increasing the concentration of the other semiconductor material in a region of the relaxed layer that is adjacent the oxide layer.

3. The method of claim 2, which further comprises heat treating the detached structure to homogenize the at least one other semi conductor material concentration in the relaxed layer.

4. The method of claim 2, which further comprises deoxidizing the detached structure to remove the oxide layer.

5. The method of claim 4, which further comprises heat treating the detached structure to homogenize the at least one other semi conductor material concentration in the relaxed layer, with the heat treatment being conducted either before or after the deoxidizing.

6. The method of claim 1, which further comprises bonding a receiving substrate to the relaxed layer.

7. The method of claim 6, wherein the receiving substrate is made of silicon.

8. The method of claim 6, which further comprises forming, prior to bonding, a bonding layer on at least one of the receiving substrate or the relaxed layer.

9. The method of claim 8, wherein the bonding layer is made of an electrically insulating material.

10. The method of claim 9, wherein the bonding layer is made of silica and is formed by oxidation.

11. The method of claim 1, which further comprises providing the weakened zone by implanting species into the buffer layer at a predetermined implantation depth.

12. The method of claim 1, which further comprises providing a porous layer as the weakened zone prior to growing the relaxed layer.

13. The method of claim 1, which further comprises conducting at least one selective etching operation on the detached structure.

14. The method of claim 13, wherein the buffer layer is selectively etched.

15. The method of claim 14, which further comprises, after etching and before enriching, growing on the strained layer a semiconductor layer of a semiconductor material that has substantially the same lattice parameter as that of the strained layer.

16. The method of claim 14, further comprising oxidizing the strained layer.

17. The method of claim 16, which further comprises annealing the wafer during or following the oxidizing to strengthen bonding of the layers.

18. The method of claim 1, which further comprises, after enriching, growing a further layer on the relaxed layer.

19. The method of claim 18, wherein the layer grown on the relaxed layer is of a strained material.

20. The method of claim 1, wherein the buffer layer is made of silicon-germanium and has a germanium concentration that increases through its thickness and includes a buffer relaxed layer, wherein the strained layer is made of silicon, and wherein the other semiconductor material of the relaxed layer is germanium so that the relaxed layer is made of substantially relaxed silicon-germanium having a germanium concentration substantially equal to the germanium concentration of the buffer relaxed layer.

21. The method of claim 1, wherein the other semiconductor material in the relaxed layer is carbon or an alloy of germanium-carbon and a strained silicon layer is provided on the relaxed layer to substantially preserve the lattice parameter of the relaxed layer.

22. The method of claim 1, wherein the wafer further comprises at least one layer containing carbon with a carbon concentration of at least one of substantially less than or equal to about 50% or substantially less than or equal to about 5%.

23. The method of claim 1, which further comprises forming at least one of the following semiconductor on insulator structures: SGOI, strained Si/SGOI, SiGe/strained Si/SGOI, or $SiO_2$/SGOI.

* * * * *

UNITED STATES PATENT AND TRADEMARK OFFICE

CERTIFICATE OF CORRECTION

PATENT NO. : 6,991,956 B2
DATED : January 31, 2006
INVENTOR(S) : Ghyselen et al.

It is certified that error appears in the above-identified patent and that said Letters Patent is hereby corrected as shown below:

Column 13,
Lines 40 and 47, change “semi conductor” to -- semiconductor --.

Column 14,
Line 26, after “strengthen bonding of the” delete “layers” and insert -- buffer layer, the strained layer and the relaxed layer --.

Signed and Sealed this

Twenty-eighth Day of March, 2006

JON W. DUDAS
*Director of the United States Patent and Trademark Office*